US010203361B2

United States Patent
Ugawa

(10) Patent No.: US 10,203,361 B2
(45) Date of Patent: Feb. 12, 2019

(54) METHOD AND APPARATUS FOR ELECTRICAL IMPEDANCE MEASUREMENTS

(71) Applicant: Agilent Technologies, Inc., Loveland, CO (US)

(72) Inventor: Hiroaki Ugawa, Tokyo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 536 days.

(21) Appl. No.: 13/907,713

(22) Filed: May 31, 2013

(65) Prior Publication Data

US 2014/0002109 A1 Jan. 2, 2014

(30) Foreign Application Priority Data

Jun. 29, 2012 (JP) .................................. 2012-147237

(51) Int. Cl.
G01R 27/00 (2006.01)
G01R 27/28 (2006.01)

(52) U.S. Cl.
CPC ............. *G01R 27/00* (2013.01); *G01R 27/28* (2013.01)

(58) Field of Classification Search
CPC ................................ G01R 27/00; G01R 27/28
USPC ...... 702/57, 65, 85, 104; 324/601, 605, 615, 324/638, 649, 750.02
See application file for complete search history.

(56) References Cited

U.S. PATENT DOCUMENTS

| 5,371,468 A * | 12/1994 | Pelster .................... G01R 27/04 324/638 |
| 5,656,973 A * | 8/1997 | Yacoubian ................ H03F 3/60 330/286 |
| 6,230,106 B1 * | 5/2001 | Metzger ............... G01R 35/005 324/601 |

(Continued)

FOREIGN PATENT DOCUMENTS

| JP | 2001-201524 A | 1/2000 |
| JP | 2006-505564 A | 10/2003 |

(Continued)

OTHER PUBLICATIONS

Agilent Technologies 8719ES Network Analyzers, Part No. 08720-90392, US 1999-2002, 2012.*

(Continued)

*Primary Examiner* — Jermele M Hollington
*Assistant Examiner* — Akm Zakaria

(57) ABSTRACT

An impedance measurement method is provided having a certain level of measurement sensitivity across all ranges of impedance and capable of covering a wide measurement range. In the method, a device under test (DUT) is connected in series or in parallel to a signal line, a measurement signal is transmitted from a signal source, an input signal $a_1$ into the DUT, a reflected signal reflected from the DUT, and a passed signal that passed through the DUT are measured, S-parameters $S_{11}$ and $S_{21}$ are calculated based on respective measured values of the input signal, the reflected signal, and the passed signal, and an impedance $Z_x$ of the DUT is calculated based on a formula: $Z_x = 2Z_0 S_{11}/S_{21}$, where $Z_0$ is a characteristic impedance.

9 Claims, 9 Drawing Sheets

TRANSMISSION METHOD (SERIAL)

$$S_{21} = \frac{b_2}{a_1} = \frac{2Z_0}{Z_X + 2Z_0}$$
$$S_{11} = \frac{b_1}{a_1} = \frac{Z_X}{Z_X + 2Z_0}$$
$$Z_X = 2Z_0 \cdot \frac{S_{11}}{S_{21}}$$

TRANSMISSION METHOD (PARALLEL)

$$S_{21} = \frac{b_2}{a_1} = \frac{2Z_X}{2Z_X + Z_0}$$
$$S_{11} = \frac{b_1}{a_1} = \frac{-Z_0}{2Z_X + Z_0}$$
$$Z_X = -\frac{Z_0}{2} \cdot \frac{S_{21}}{S_{11}}$$

(56) References Cited

U.S. PATENT DOCUMENTS

| | | | | |
|---|---|---|---|---|
| 6,472,885 B1* | 10/2002 | Green | | G01N 22/00 |
| | | | | 324/638 |
| 6,853,198 B2* | 2/2005 | Boudiaf | | G01R 27/28 |
| | | | | 324/601 |
| 6,920,407 B2* | 7/2005 | Adamian | | C01B 31/0206 |
| | | | | 324/601 |
| 7,068,049 B2* | 6/2006 | Adamian | | G01R 27/28 |
| | | | | 324/612 |
| 7,098,670 B2* | 8/2006 | Cole | | G01R 27/28 |
| | | | | 324/601 |
| 7,646,205 B2* | 1/2010 | Berlin | | G01R 27/28 |
| | | | | 324/638 |
| 7,660,685 B2* | 2/2010 | Pupalaikis | | H04L 12/2697 |
| | | | | 324/72.5 |
| 7,805,265 B2* | 9/2010 | Namba | | G01R 27/28 |
| | | | | 324/601 |
| 8,319,502 B2* | 11/2012 | Hashimshony | | G01R 35/007 |
| | | | | 324/601 |
| 8,423,868 B2* | 4/2013 | Fujii | | G01R 35/005 |
| | | | | 714/774 |
| 2003/0030504 A1* | 2/2003 | Dixit | | H03H 3/00 |
| | | | | 333/32 |
| 2005/0093554 A1* | 5/2005 | Wang | | G01R 27/32 |
| | | | | 324/638 |
| 2010/0244840 A1* | 9/2010 | McKinnon | | G01R 33/288 |
| | | | | 324/322 |
| 2011/0199107 A1* | 8/2011 | Adamian | | G01R 35/005 |
| | | | | 324/750.02 |
| 2011/0304457 A1 | 12/2011 | Baysov | | |
| 2013/0234741 A1* | 9/2013 | Mow | | H01Q 1/243 |
| | | | | 324/750.01 |

FOREIGN PATENT DOCUMENTS

| | | |
|---|---|---|
| JP | 2006-242792 A | 9/2006 |
| WO | 2006-115110 A1 | 4/2006 |
| WO | 2006-090550 A1 | 8/2006 |

OTHER PUBLICATIONS

Notice of Allowance dated Nov. 18, 2016, in Japan Application 2012-147237. English translation not available.

* cited by examiner

REFLECTION COEFFICIENT METHOD $$S_{11} = \frac{b_1}{a_1} = \Gamma = \frac{Z_X - Z_0}{Z_X + Z_0} = \frac{z_X - 1}{z_X + 1}$$

$$Z_X = Z_0 \cdot \frac{1 + S_{11}}{1 - S_{11}}$$

TRANSMISSION METHOD (SERIAL)

$$S_{21} = \frac{b_2}{a_1} = \frac{2Z_0}{Z_X + 2Z_0} = \frac{2}{z_X + 2}$$

$$Z_X = 2Z_0 \cdot \frac{1 - S_{21}}{S_{21}}$$

TRANSMISSION METHOD (PARALLEL)

$$S_{21} = \frac{b_2}{a_1} = \frac{2Z_X}{2Z_X + Z_0} = \frac{2z_X}{2z_X + 1}$$

$$Z_X = \frac{Z_0}{2} \cdot \frac{S_{21}}{1 - S_{21}}$$

US 10,203,361 B2

METHOD AND APPARATUS FOR ELECTRICAL IMPEDANCE MEASUREMENTS

CROSS REFERENCE TO RELATED APPLICATIONS

This application claims priority from Japanese Application No. 2012-147237 filed Jun. 29, 2012. The specification is incorporated herein by reference.

BACKGROUND

Accurate impedance measurements of a "component" used in a high-frequency band are required for characteristics evaluation of that component. Here, a "component" is a two-terminal device, for example, a resistor, a capacitor, an inductor, a diode, or a pattern on a printed circuit board, etc., and shall be referred to as a device under test (DUT).

Conventional methods for measuring the impedance of a DUT using automatic balanced bridge methods are limited to frequencies of no more than approximately 110 MHz. Radio frequency current-voltage (RF I-V) methods are limited to a frequency range of approximately 1 MHz to 3 GHz. With each of these methods, a wide range of impedance can be measured at high accuracy. However, the commercially available apparatuses are limited to frequencies below 3 GHz.

Methods that enable impedance measurement at frequencies above approximately 3 GHz using network analysis methods (S-parameter methods) are known; both a reflection coefficient method and a transmission method are known. In the reflection coefficient method, a vector voltage ratio $S_{11}$ of an input signal and a reflected signal, that is, a reflection coefficient G with respect to a DUT is measured. In the transmission method, the DUT is connected in series or parallel between two test ports and a vector voltage ratio $S_{21}$ ($b_2/a_1$) of an input signal and an output signal is measured.

Conventionally, in the reflection coefficient method, $S_{11}$ is measured to determine the impedance $Z_x$ of the DUT. In the transmission method, the vector voltage ratio $S_{21}$ is measured to determine the impedance $Z_x$.

In regard to the reflection coefficient method, FIG. 5(a) shows the principles, wherein a relationship formula between the vector voltage ratio $S_{11}$ and the impedance $Z_x$ of a DUT, and a calculation formula for determining the impedance $Z_x$ are given. In the figures, $Z_0$ denotes a characteristic impedance (e.g. 50Ω).

In regard to the transmission method FIGS. 5(b) and 5(c) show the relationship between the vector voltage ratio $S_{21}$ and the impedance $Z_x$ of the DUT. In particular, the formula for determining the impedance $Z_x$ for cases of connecting the DUT in series and parallel are given, respectively.

FIG. 6 is a graph showing the relationships between the impedance $Z_x$ and the vector voltage ratios $S_{11}$ and $S_{21}$ in the respective methods. A solid line indicates the vector voltage ratio $S_{11}$ ($b_1/a_1$) of the input signal $a_1$ and the reflected signal $b_1$ in the reflection coefficient method. Alternate long and short dash lines indicate the vector voltage ratios $S_{21}$ ($b_2/a_1$) of the input signal $a_1$ and the output signal $b_2$ in the respective transmission methods in which the DUT is connected in series and in parallel, respectively. Broken lines indicate the vector voltage ratios $S_{11}$ ($b_1/a_1$) of the input signal $a_1$ and the reflected signal $b_1$ in the transmission methods in which the DUT is connected in series and in parallel, respectively. An abscissa axis indicates the impedance $Z_x$ normalized by the characteristic impedance $Z_0$.

Related prior art document is for example, Agilent_Technologies: "Impedance Measurement Handbook," Nov. 2011 edition (cp.literature.agilent.com/litweb/pdf/5950-3000JA.pdf)

SUMMARY

The present invention includes a method and apparatus for impedance measurements. In one aspect of the invention, the method includes connecting a DUT in series or parallel to a signal line with respect to a signal source, transmitting a measurement signal from the signal source through the signal line, and measuring an input signal into the DUT, a reflected signal reflected from the DUT, and a passed signal passed through the DUT. S-parameters $S_{11}$ and $S_{21}$ based on respective measured values of the input signal, reflected signal, and passed signal are calculated; and an impedance $Z_x$ of the DUT is calculated from S-parameters and a characteristic impedance.

In one aspect of the invention, the DUT is connected between a first port and a second port of a network analyzer, with one of the ports connected to a signal source and the other connected to a load device. Measurements are then made in respective cases of interchange of the signal source and the load device by a switch to obtain a geometric mean (GM) of the impedances determined in the respective cases.

In another aspect of the invention, impedance measurement apparatus includes a signal source, a port for connecting a DUT, a measurement circuit, and an S-parameter calculating circuit. The signal source transmits a measurement signal through a signal line. The port connects the DUT in series to the signal line. The measurement circuit transmits the measurement signal from the signal source and measures an input signal into the DUT, a reflected signal reflected from the DUT, and a passed signal passed through the DUT. The S-parameter calculating circuit calculates S-parameters $S_{11}$ and $S_{21}$ based on respective measured values of the input signal, reflected signal, and passed signal. An impedance calculating circuit calculates an impedance $Z_x$ of the DUT from the S-parameters and a characteristic impedance.

In another aspect of the invention, the measurement method includes connecting the DUT in parallel between a signal line and a ground line with respect to a signal source, transmitting a measurement signal from the signal source through the signal line, to form an input signal into the DUT, measuring a reflected signal reflected from the DUT and a passed signal passed through the DUT, and calculating the S-parameters and impedance of the DUT from the S-parameters and a characteristic impedance.

In yet another aspect of the invention, the measurement apparatus includes a signal source that transmits a measurement signal through a signal line, a port that connects the DUT in parallel to the signal line, a measurement circuit that transmits the measurement signal from the signal source to form an input signal into the DUT, and measures the input signal, a reflected signal reflected from the DUT, and a passed signal passed through the DUT. An S-parameter calculating circuit calculates S-parameters $S_{11}$ and $S_{21}$ based on respective measured values of the input signal, reflected signal, and passed signal, and an impedance calculating circuit that calculates an impedance $Z_x$ of the DUT from the S-parameters and a characteristic impedance.

DETAILED DESCRIPTION

Figure 1A:
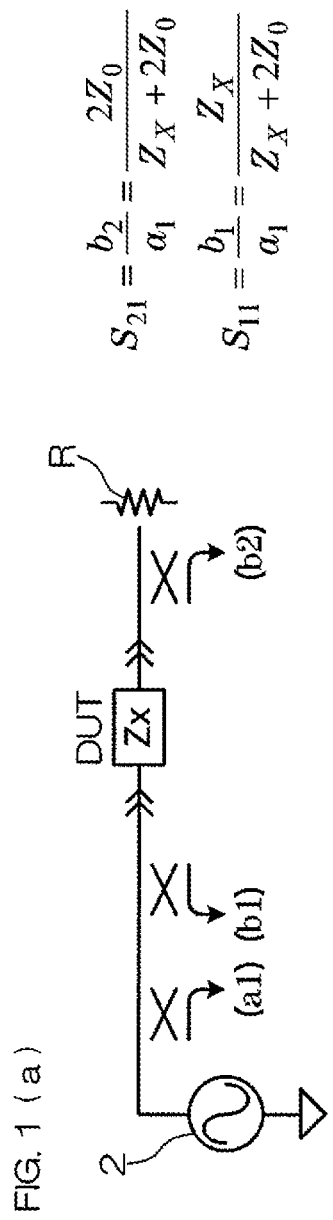
FIG. 1(a) is a schematic view for describing principles of impedance measurement of a DUT connected in series to a signal line and shows a measurement principle diagram, a relationship formula between vector voltage ratios $S_{21}$ and $S_{11}$ and an impedance $Z_x$, and a calculation formula for determining the impedance $Z_x$.
Figure 1:
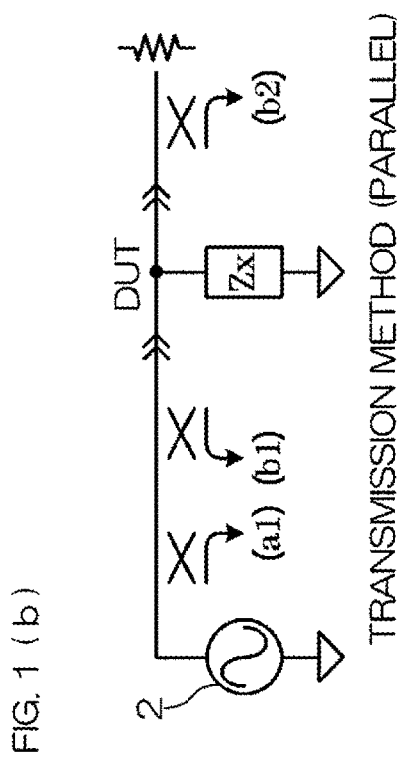
FIG. 1(b) is a schematic view for describing principles of impedance measurement of the DUT connected in parallel to the signal line and shows a measurement principle diagram, a relationship formula between the vector voltage ratios $S_{21}$ and $S_{11}$ and the impedance $Z_x$, and a calculation formula for determining the impedance $Z_x$.

The present invention provides functions and performances equivalent to a dedicated impedance analyzer at higher frequencies without using a dedicated impedance analyzer and at a cost that is substantially less than such an analyzer. The present invention uses functions of a commercially-available, general-purpose, wide-band network analyzer, and for this purpose, the invention resolves several issues in the network analysis methods that have previously limited their use.

For the purposes of this discussion, "measurement sensitivity" is defined as a change of measurement signal level in accordance with a change of impedance, $Z_x$, of a DUT. "Error magnification factor" is defined as a reciprocal of the measurement sensitivity. For example, in the reflection coefficient method, the error magnification factor is defined to be the value indicating how a change of impedance $Z_x$ is magnified when a measured value of $S_{11}$ changes. As can be understood from FIG. 6, with the reflection coefficient method, when the measured impedance $Z_x$ is close to the characteristic impedance $Z_0$, the reflection coefficient G changes drastically even with a slight change of impedance. Hence, the impedance $Z_x$ can be determined with high measurement sensitivity in a range close to the characteristic impedance $Z_0$. However, the measurement sensitivity decreases if the impedance $Z_x$ is away from the characteristic impedance $Z_0$. That is, with the reflection coefficient method, the error magnification factor is small when $Z_x$ is close to $Z_0$, and the error magnification factor increases the further away $Z_x$ is from $Z_0$. Thus, with the reflection coefficient method accurate measurements are not obtained when the reflection coefficient G is significantly greater than 0.

When the transmission method in which the DUT is connected in series is used, the smaller the impedance $Z_x$ is with respect to the characteristic impedance $Z_0$, the closer the vector voltage ratio $S_{21}$ is to 1, which leads to a greater error magnification factor.

With the transmission method in which the DUT is connected in parallel, the greater the impedance $Z_x$ is with respect to the characteristic impedance $Z_0$, the closer the vector voltage ratio $S_{21}$ is to 1, which leads to lower the measurement sensitivity of the impedance $Z_x$, when the impedance $Z_x$ is small. In this case, $S_{21}$ changes rapidly and the error magnification factor approaches 1.

Thus, with the conventional methods, it is difficult to measure the impedance $Z_x$ over a wide range which limits the dynamic range of measurement. In addition, the experimenter must vary the form of connection, i.e., parallel or series, in accordance with the range of impedance to be measured. Hence, an impedance measurement method and apparatus having a certain level of measurement sensitivity across all ranges of the impedance $Z_x$ and capable of covering a wide measurement range is needed.

In an impedance measurement apparatus that uses a network analyzer, the stability of the measurement apparatus main unit influences the measurement accuracy. Hence, a method that uses a network analyzer while canceling out the drift introduced by the measurement apparatus is needed.

The present invention provides a DUT connected in series to a signal line with respect to a signal source that provides an input signal that is transmitted through the signal line into the DUT. A reflected signal from the DUT and a passed signal through the DUT are measured, and S-parameters $S_{11}$ and $S_{21}$ are calculated based on the respective measured values of the input signal, reflected signal, and passed signal, and an impedance $Z_x$ of the DUT is calculated with the formula:

$$Z_x = 2Z_0 S_{11}/S_{21}$$

(where $Z_0$ is a characteristic impedance).

The above method and apparatus can be instantiated using a network analyzer by connecting the DUT between a first port and a second port of the network analyzer, with one of the ports being connected to a signal source and the other being connected to a load device, and making a measurement signal be transmitted from the signal source.

In the present invention, forward direction measurements and reverse direction measurements are combined to reduce the influence of the main measurement apparatus drift on the accuracy of the measurements. Measurements are made by interchanging the signal source and the load device by a switch, and a GM of the impedances obtained in the respective cases is determined.

The present invention provides an impedance measurement method and apparatus that includes a process where a two-port side of a converter that converts two ports to one port is connected between a first port and a second port of a network analyzer, with one of the ports being connected to a signal source and the other being connected to a load device. A DUT is connected between the one port side of the converter and the ground, a measurement signal is transmitted from the signal source, and a ratio of the S-parameters $S_{21}$ and $S_{11}$ is determined. Hence, the present invention provides a measurement terminal of a coaxial shape in the same manner as a normal measurement apparatus dedicated to impedance measurement and enabling the use of available traceable impedance standards, etc.

Refer now to FIG. 1(a) is a schematic view for describing measurement principles of measuring an impedance of a DUT connected in series to a signal line. A signal output from a signal source 2 is partially separated by a directional coupler in the middle of being input into the DUT and an input signal $a_1$ into the DUT is thereby measured. A signal reflected from the DUT is partially separated by a directional coupler and a reflected signal $b_1$ from the DUT is thereby measured. Also, a signal that passed through the DUT is partially separated by a directional coupler and a passed signal $b_2$ of the DUT is thereby measured. R denotes a terminating resistor.

With the DUT, there are four vector voltage ratios, in other words, four S-parameters, and among these, $S_{11}$ expresses reflection from the input port of the DUT. $S_{21}$ expresses forward direction transmission through the DUT. To express these as formulas:

$$S_{21}=b_2/a_1=2Z_0/(Z_x+2Z_0).$$

$$S_{11}=b_1/a_1=Z_x/(Z_x+2Z_0).$$

By taking the ratio of the two, $$Z_x=2Z_0 S_{11}/S_{21} \quad (1)$$

is obtained and $Z_x$ is thereby determined. If $Z_x$ divided by $Z_0$ is written as "zx," zx is expressed by:

$$zx=2S_{11}/S_{21}.$$

This is the formula that expresses the method according to the present invention for impedance measurement of the serially connected DUT.

FIG. 1(b) is a schematic view for describing measurement principles of measuring the impedance of the DUT connected in parallel to the signal line. The signal output from a signal source 2 is partially separated by the directional coupler in the middle of being input into the DUT and the input signal $a_1$ into the DUT is thereby measured. The signal reflected from the DUT is partially separated by the directional coupler and the reflected signal $b_1$ from the DUT is thereby measured. Also, the signal that passed through the DUT is partially separated by the directional coupler and the passed signal $b_2$ of the DUT is thereby measured.

With the DUT, there are four vector voltage ratios, in other words, four S-parameters, and among these, $S_{11}$ expresses reflection from the input port of the DUT. $S_{21}$ expresses forward direction transmission through the DUT. To express these as formulas:

$$S_{21}=b_2/a_1=2Z_x/(Z_x+2Z_0),$$

$$S_{11}=b_1/a_1=-Z_0/(2Z_x+Z_0).$$

By taking the ratio of the two, $$Z_x=-Z_0 S_{21}/2S_{11} \quad (2)$$

is obtained and Zx is thereby determined. "zx," determined by dividing Zx by $Z_0$ is expressed by:

$$zx=-S_{21}/2S_{11}.$$

This expresses the method for impedance measurement of the DUT connected in parallel.

Figure 2:
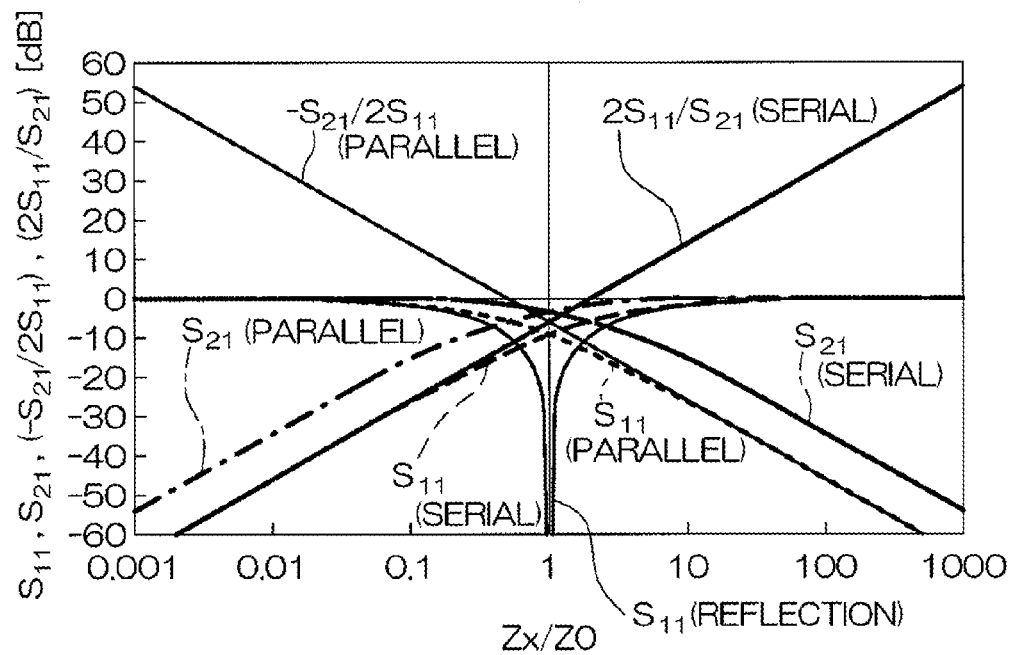
FIG. 2 is a graph expressing the impedance of the DUT with an ordinate axis indicating $2S_{11}/S_{21}$ and $-S_{21}/2S_{11}$ and an abscissa axis indicating $Z_x/Z_0$.
Figure 6:
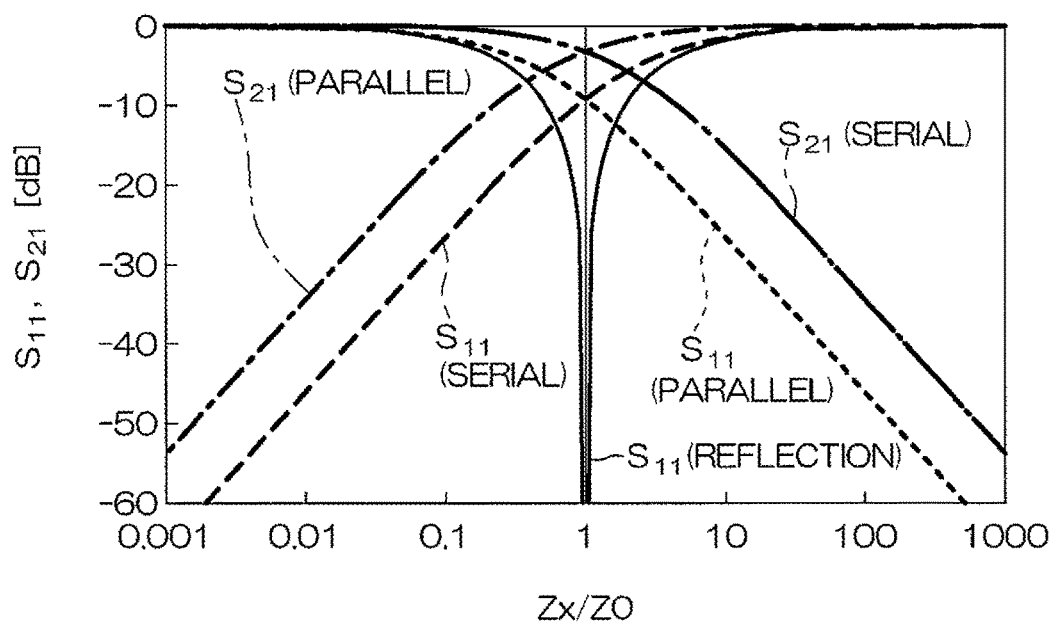
FIG. 6 is a graph showing relationships between the impedance $Z_x$ and the vector voltage ratios $S_{11}$ and $S_{21}$ according to the respective conventional methods.

A graph with an ordinate axis indicating $2S_{11}/S_{21}$ and $-S_{21}/2S_{11}$ expressed by the two formulas (1) and (2) and an abscissa axis indicating $Z_x/Z_0$ is shown in FIG. 2. The graph of $S_{11}$ according to the reflection coefficient method, the graphs of $S_{11}$ and $S_{21}$ in the case of connecting the DUT in series, and the graphs of $S_{11}$ and $S_{21}$ in the case of connecting the DUT in parallel, which were shown in FIG. 6, are also shown together.

The graph of FIG. 2 shows that $2S_{11}/S_{21}$, which expresses zx connected in series, is fixed in slope and thus fixed in measurement sensitivity across all ranges of $Z_x/Z_0$. It is also shown that $-S_{21}/2S_{11}$, which expresses zx connected in parallel, is also fixed in slope and thus fixed in measurement sensitivity across all ranges of $Z_x/Z_0$.

The object of the present invention of providing an impedance measurement method and measurement apparatus having a certain level of measurement sensitivity across all ranges of impedance and capable of covering a wide measurement range is thus completely achieved.

The impedance measurement method according to the present invention can be implemented by using a network analyzer, connecting the DUT between a first port and a second port of the network analyzer, with one of the ports being connected to a signal source and the other being connected to a load device, and making a measurement signal be transmitted from the signal source. By this method, impedance measurement can be performed using an existing network analyzer as it is.

Figure 3:
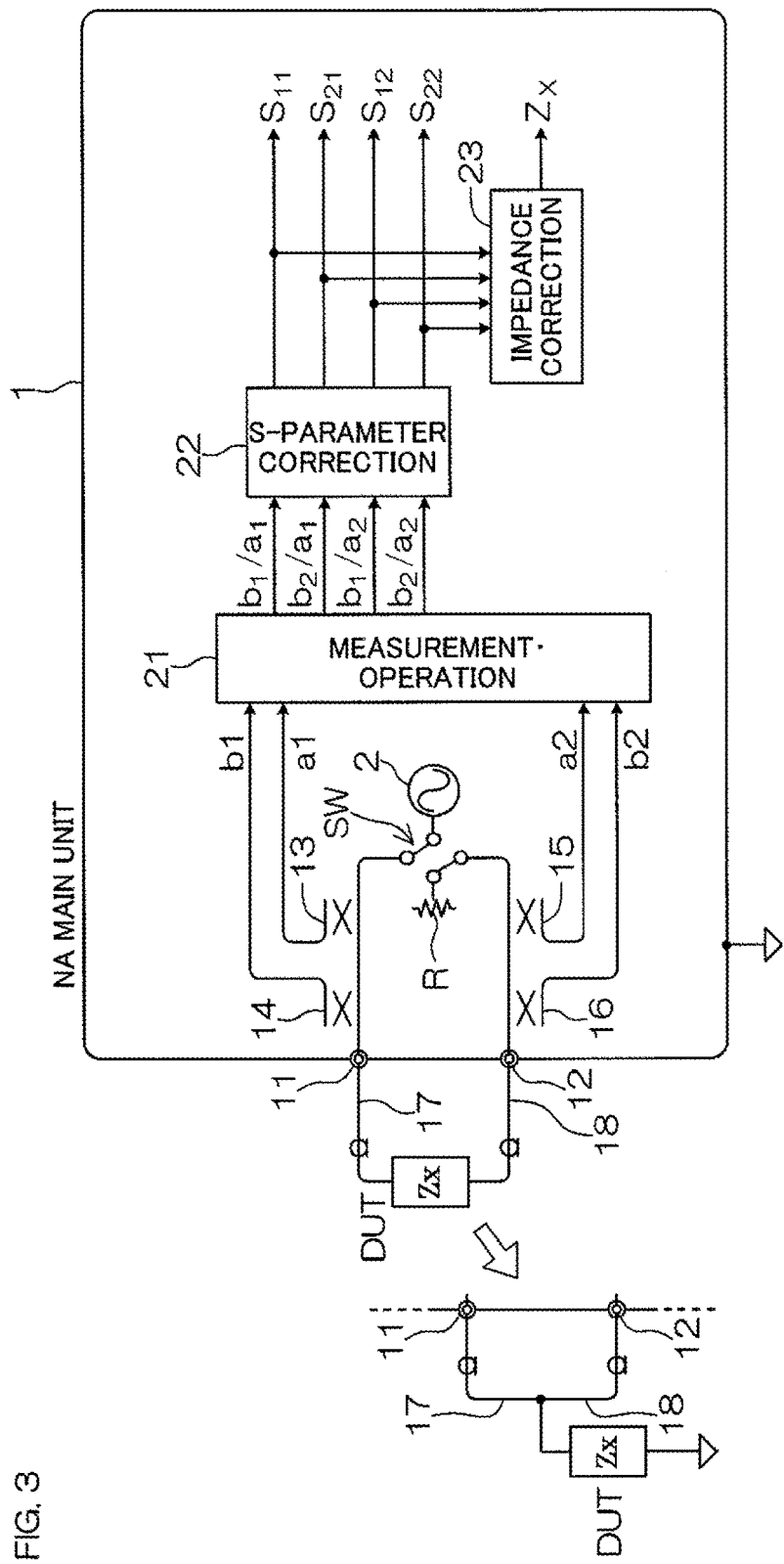
FIG. 3 is a schematic block diagram of an entirety of a measurement apparatus including a network analyzer 1 for implementing a method for measuring the impedance of a DUT connected in series.

FIG. 3 is a schematic block diagram of an entirety of a measurement apparatus including a network analyzer 1 for implementing a method for measuring the impedance of a DUT connected in series.

The network analyzer 1 has a first port 11 and a second port 12 and through a changeover switch SW, one of the ports is connected to a signal source 2 and the other port is connected to a load device R. The signal source 2 generates a sinusoidal high-frequency wave as a measurement signal. The load device R is a resistive device having a resistance value corresponding to a characteristic impedance $Z_0$.

By forward/reverse changeover of the changeover switch SW, changeover between a state where the first port 11 is made to function as an output port and the second port 12 is made to function as an input port and a state where the first port 11 is made to function as the input port and the second port 12 is made to function as the output port can be performed.

A directional coupler 13 for detecting a signal $a_1$ traveling from the changeover switch SW to the first port 11 and a directional coupler 14 for detecting a signal $b_1$ returning from the first port 11 to the changeover switch SW are disposed in an internal line connecting the first port 11 and the changeover switch SW. Also, a directional coupler 15 for detecting a signal $a_2$ traveling from the changeover switch SW to the second port 12 and a directional coupler 16 for detecting a signal $b_2$ returning from the second port 12 to the changeover switch SW are disposed in an internal line connecting the second port 12 and the changeover switch SW.

The DUT is connected in series with respect to signal lines 17 and 18 that connect the first port 11 and the second port 12.

The respective signals $a_1$, $a_2$, $b_1$, and $b_2$ are supplied to a measurement/operation circuit 21 of the network analyzer 1 and the respective S-parameters $S_{11}$, $S_{21}$, $S_{12}$, and $S_{22}$ are calculated here.

The network analyzer 1 further includes an S-parameter correction circuit 22 and an impedance correction circuit 23.

An impedance measurement procedure is as follows.

The changeover switch SW is set so that the first port 11 is connected to the signal source 2, the measurement signal is transmitted from the signal source 2 to the first port 11, and the input signal $a_1$ into the DUT, the reflected signal $b_1$ reflected from the DUT, and the passed signal $b_2$ that passed through the DUT are measured and input into the measurement/operation circuit 21. The measurement/operation circuit 21 calculates the S-parameters $S_{11}$ and $S_{21}$ based on the respective measured values of the input signal $a_1$, the reflected signal $b_1$, and the passed signal $b_2$.

The S-parameter correction circuit 22 makes use of the reciprocity of the DUT, the signals $a_1$, $b_1$, and $b_2$, and the signal $a_2$ to cancel out impedance variation of the load device R and the signal source 2 and thereby corrected S-parameters can be realized using functions normally included in a network analyzer for eliminating errors of the signal source, receiver, directional coupler, and connection cables.

The corrected S-parameters are supplied to the impedance correction circuit 23 where the impedance Z'x of the DUT is calculated by $$Z'x = 2Z_0 S_{11}/S_{21} \quad (3)$$

The correction function of the impedance correction circuit will be discussed below.

Next, the changeover switch SW is operated so that the second port 12 is connected to the signal source 2, the measurement signal is transmitted from the signal source 2 to the second port 12, and the input signal $a_2$ into the DUT, the reflected signal $b_2$ reflected from the DUT, and the passed signal $b_1$ that passed through the DUT are measured and input into the measurement/operation circuit 21. The measurement/operation circuit 21 calculates the S-parameters $S_{11}$ and $S_{21}$ based on the respective measured values of the input signal $a_2$, the reflected signal $b_2$, and the passed signal $b_1$ and based on the formula:

$$S_{11} = b_2/a_2, \ S_{21} = b_1/a_2.$$

The S-parameter correction circuit 22 makes use of the reciprocity of the DUT, the signals $a_2$, $b_1$, and $b_2$, and the signal $a_1$ to cancel out impedance variation of the load device R and the signal source 2 and correct the S-parameters.

The corrected S-parameters are supplied to the impedance correction circuit 23 where the impedance Z"x of the DUT is calculated by $$Z''x = 2Z_0 S_{11}/S_{21} \quad (4)$$

The impedances Z'x and Z"x calculated by formulas (3) and (4) should be equal in value because these are measurement data of the same DUT. If these differ, drift of the measurement apparatus during measurement has occurred. The impedance correction circuit 23 thus uses the following formula $$Z_x = (Z'x \cdot Z''x)$$

to determine a GM of the two values of impedance data Z'x and Z"x and outputs the result as the impedance $Z_x$ of the DUT. Drift error that occurs during the two times of measurement by the network analyzer 1 can thereby be canceled out.

Although the method of measuring the impedance of the DUT connected in series has been described, a method for measuring the impedance of a DUT connected in parallel can also be performed with the arrangement shown in FIG. 3. For this purpose, the DUT is connected between the ground and the signal lines 17 and 18, connecting the first port 11 and the second port 12, as shown in the lower left portion of the figure. Although a description shall be omitted because the internal arrangement of the network analyzer 1 and the measurement method are the same as in the case of measuring the impedance of the DUT connected in series, a difference with respect to the serial method is that the formula for calculating the impedance $Z_x$ of the DUT is:

$$Z_x = -Z_0 S_{21}/2S_{11} \quad (5)$$

As described above, it is preferable to make measurements twice by forward/reverse changeover of the changeover switch SW and to take the GM of the two measurement results.

Figure 4:
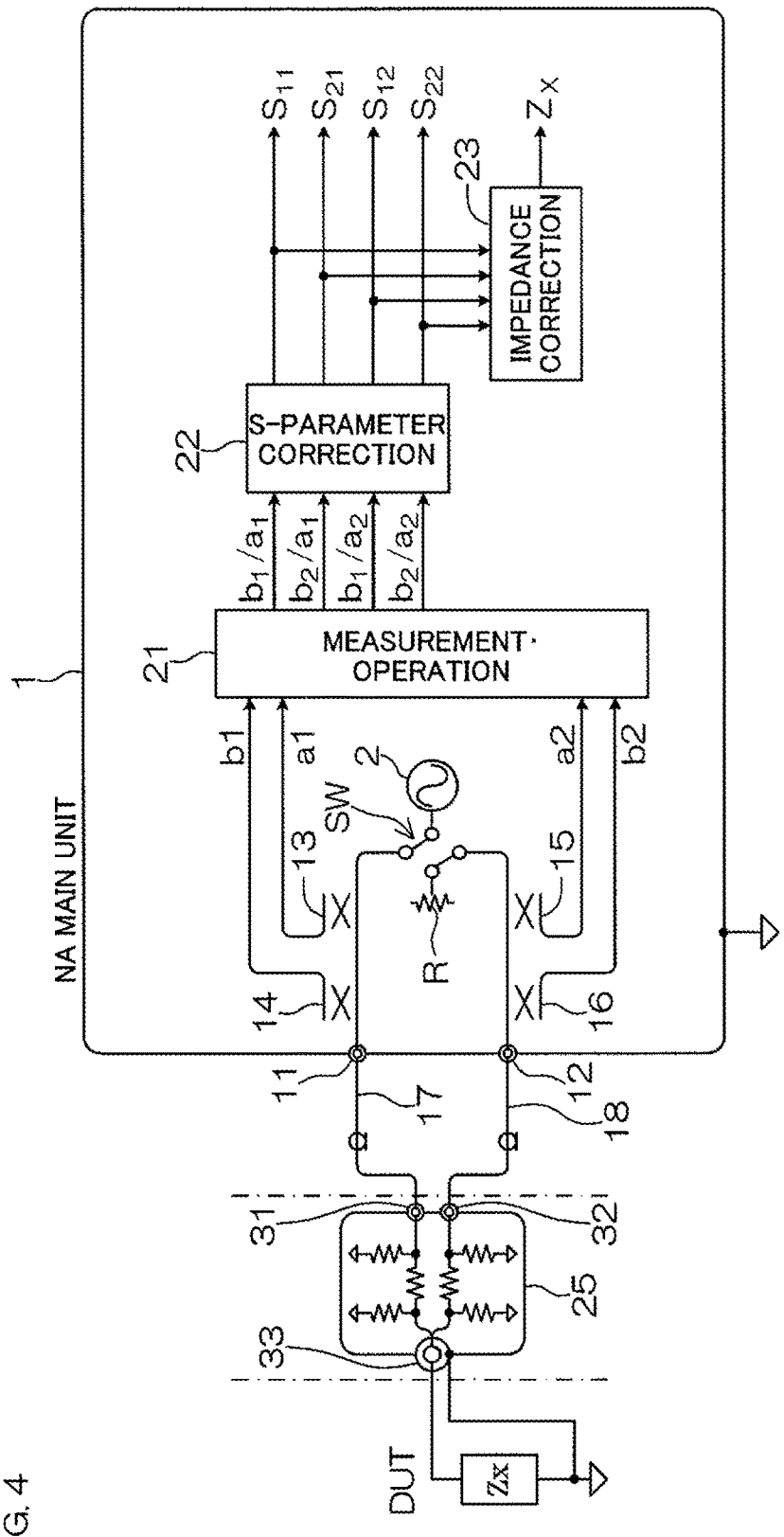
FIG. 4 is a schematic block diagram of an entirety of a measurement apparatus including the network analyzer 1 related to another preferred embodiment for implementing a method for measuring the impedance of a DUT connected in parallel.
Figure 5A:
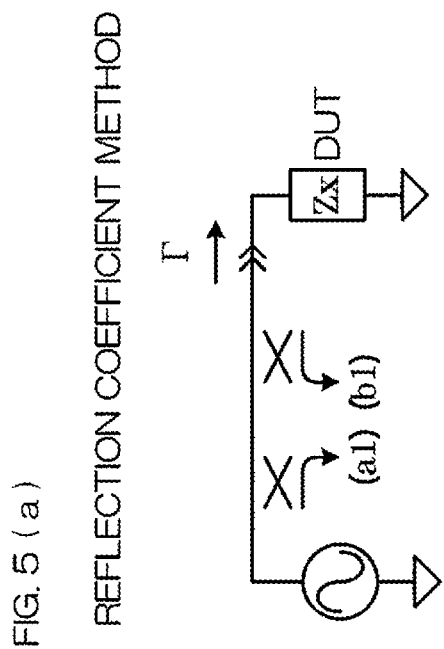
FIGS. 5(a)-5(c) are diagrams showing principle diagrams, a relationship formula between vector voltage ratios $S_{11}$ and $S_{21}$ and an impedance $Z_x$ of a DUT, and a calculation formula for determining the impedance $Z_x$ according to conventional methods.
Figure 5:
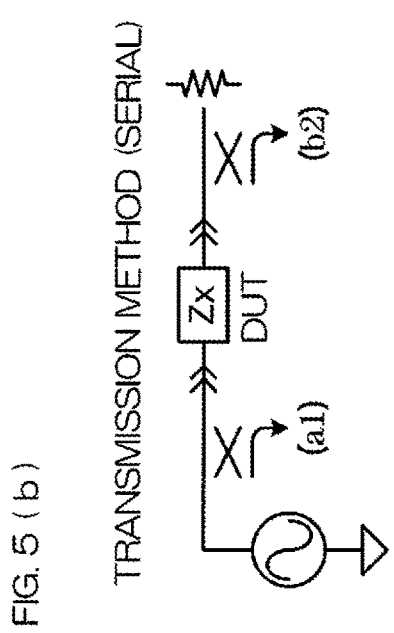
Figure 5:
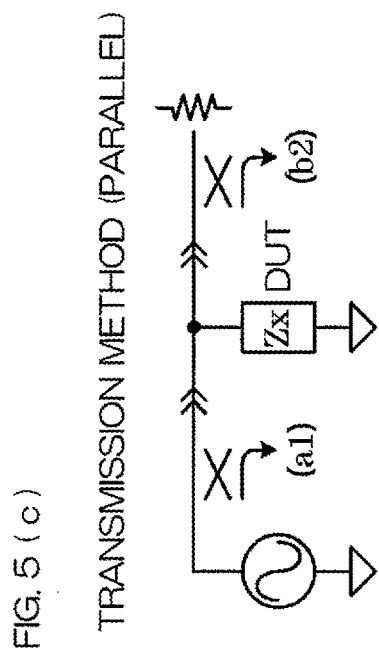

FIG. 4 is a schematic block diagram of an entirety of a measurement apparatus including the network analyzer 1 related to another preferred embodiment for implementing a method for measuring the impedance of a DUT connected in parallel.

A difference with respect to the arrangement of FIG. 3 is that a two-port/one-port converter 25 is used to connect the DUT.

To describe the circuit of the two-port/one-port converter 25, a third input port 31 connected to the line and a fourth input port 32 connected to the line are connected by two serial resistors and an intermediate point of the connection is connected to an output port 33. The third input port 31 is grounded via a resistor, the fourth input port 32 is grounded via a resistor, and the output port 33 is also grounded via a resistor. The DUT is connected between the output port 33 and the ground.

By using the two-port/one-port converter 25 with the above arrangement, a change at the measurement apparatus side from the viewpoint of the DUT can be alleviated. Also, the impedance of the measurement apparatus side from the viewpoint of the DUT can be converted to an appropriate value. With a dedicated impedance measurement apparatus, the measured value is calibrated using known impedance standards in advance to obtain an accurate absolute value of the impedance measurement value. With an impedance standard, an accurate impedance is obtained by calculation from physical dimensions and material physical constants, and open, shorted, and matched terminations are normally used in many cases.

A reference plane is changed from a two-port arrangement to a coaxial one-port arrangement by the two-port/one-port converter 25, and by measuring the impedance standards in the coaxial one-port arrangement, an additional error due to the converter 25 is eliminated and calibration of the absolute value of impedance with the coaxial one-port arrangement as the reference plane is enabled. A means for the calibration is also included in the impedance correction circuit 23.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An impedance measurement method comprising:
    connecting a device under test (DUT) characterized by a DUT input and a DUT output, in series to a signal line with respect to a signal source and a load device, said DUT input being connected to said signal line and said DUT output being connected to said load device;
    transmitting a measurement signal from the signal source through the signal line;
    measuring an input signal into the DUT, a reflected signal reflected from the DUT, and a passed signal passed through the DUT into said load device while the DUT input is connected to the signal line, the DUT output is connected to the load device, and the measurement signal is transmitted through the signal line;

calculating S-parameters $S_{11}$ and $S_{21}$ based on respective measured values of the input signal, reflected signal, and passed signal; and calculating an impedance $Z_x$ of the DUT from a ratio of $S_{11}$ divided by $S_{21}$ and a characteristic impedance.

2. An impedance measurement method of claim 1 further comprising:
connecting the DUT between a first port and a second port of a network analyzer, with one of the ports being connected to a signal source and the other being connected to said load device.

3. The impedance measurement of claim 2, wherein each of said measurements is made in respective cases of interchange of the signal source and the load device by a switch to obtain a geometric mean (GM) value of $Z_x$ determined in the respective cases, as a function of frequency of the measurement signal.

4. An impedance measurement apparatus comprising:
a signal source that transmits a measurement signal through a signal line;
a port for connecting a DUT in series or in parallel to the signal line;
a measurement circuit that transmits the measurement signal from the signal source and measures an input signal into the DUT, a reflected signal reflected from the DUT, and a passed signal passed through the DUT;
an S-parameter calculating circuit calculating S-parameters $S_{11}$ and $S_{21}$ based on respective measured values of the input signal, reflected signal, and passed signal; and
an impedance calculating circuit that calculates an impedance $Z_x$ of the DUT from a ratio of $S_{11}$ divided by $S_{21}$ and a characteristic impedance.

5. An impedance measurement method comprising:
connecting a DUT in parallel between a signal line and a ground line with respect to a signal source, said DUT being characterized by first and second ports, said first port of said DUT being connected directly to said signal line and said second port of said DUT being connected directly to said ground line, a load device being connected in parallel with said DUT, said load device having a first terminal connected directly to said first port of said DUT and a second terminal connected directly to said second port of said DUT;
transmitting a measurement signal from the signal source through the signal line, to form an input signal into the DUT,
measuring a reflected signal reflected from the DUT,
measuring a passed signal that passes between said first port of said DUT and said load device;
calculating S-parameters $S_{11}$ and $S_{21}$ based on respective measured values of the input signal, reflected signal, and passed signal; and
calculating an impedance $Z_x$ of the DUT from a ratio of $S_{11}$ divided by $S_{21}$ and a characteristic impedance.

6. The impedance measurement method of claim 5 further comprising:
connecting a first port and a second port of a network analyzer such that one of the ports of the network analyzer is connected to said signal source and measures the signals traveling between the signal source and first port of said DUT and the other port of the network analyzer is connected to said load device and measures the signals traveling from the DUT to the load device.

7. The impedance measurement method of claim 6 further comprising:
connecting a two-port side of a converter that converts two ports to one port between a first port and a second port of a network analyzer, with one of the ports being connected to a signal source and the other being connected to a load device, said converter providing said connection between said first and second ports of said network analyzer and said first port of said DUT, said DUT being connected to the one-port side of the converter.

8. The impedance measurement method of claim 6, wherein measurements are made in respective cases of interchange of the signal source and the load device by a switch to obtain the GM of the impedances determined in the respective cases as a function of frequency of the measurement signal.

9. The impedance measurement method of claim 7 wherein measurements are made in respective cases of interchange of the signal source and the load device by a switch to obtain the GM of the impedances determined in the respective cases as a function of frequency of the measurement signal.

* * * * *